(12) United States Patent
Du et al.

(10) Patent No.: US 8,689,149 B1
(45) Date of Patent: Apr. 1, 2014

(54) MULTI-PATTERNING FOR SHARP CORNER PRINTING

(71) Applicant: Synopsys, Inc., Mountain View, CA (US)

(72) Inventors: Yuelin Du, Champaign, IL (US); Hua Song, San Jose, CA (US); James Shiely, Aloha, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/740,142

(22) Filed: Jan. 11, 2013

(51) Int. Cl.
*G06F 17/50* (2006.01)

(52) U.S. Cl.
USPC .............................................. 716/51; 716/54

(58) Field of Classification Search
USPC ...................................................... 716/51, 54
See application file for complete search history.

(56) References Cited

U.S. PATENT DOCUMENTS

| | | | |
|---|---|---|---|
| 6,818,559 | B2 | 11/2004 | Leon et al. |
| 8,434,043 | B1 * | 4/2013 | Hsu et al. ...................... 716/113 |
| 2001/0040648 | A1 * | 11/2001 | Ono et al. ....................... 349/43 |
| 2005/0095512 | A1 * | 5/2005 | Moukara et al. .................. 430/5 |
| 2008/0003510 | A1 * | 1/2008 | Harazaki ........................... 430/5 |
| 2008/0037861 | A1 * | 2/2008 | Nikolsky ...................... 382/149 |
| 2009/0070083 | A1 | 3/2009 | Zhang |
| 2009/0070730 | A1 | 3/2009 | Zhang |
| 2009/0265148 | A1 | 10/2009 | Zhang |
| 2009/0271759 | A1 * | 10/2009 | Torres Robles et al. ........ 716/19 |
| 2011/0317908 | A1 * | 12/2011 | Park .............................. 382/145 |
| 2012/0034721 | A1 * | 2/2012 | Okamoto et al. ............... 438/30 |
| 2012/0096414 | A1 * | 4/2012 | Sweis ............................. 716/53 |
| 2012/0102440 | A1 * | 4/2012 | Sweis ............................. 716/53 |
| 2013/0061185 | A1 * | 3/2013 | Abou Ghaida et al. ......... 716/55 |
| 2013/0080980 | A1 * | 3/2013 | Wang et al. ..................... 716/52 |
| 2013/0091476 | A1 * | 4/2013 | Chen et al. ...................... 716/55 |

OTHER PUBLICATIONS

"Sharp Vertices in Asymmetric Y-Junctions by Double Masking", J. J. G. M. van der Tol, et al., IEEE Photonics Technology Letters, vol. 6, No. 2, Feb. 1994, pp. 249-251.
"Buried Rib Passive Waveguide Y Junctions with Sharp Vertex on InP", Yosi Shani, et al., IEEE Photonics Technology Letters. vol. 3. No. 3, Mar. 1991, pp. 210-212.

* cited by examiner

*Primary Examiner* — Suresh Memula
(74) *Attorney, Agent, or Firm* — Adams Intellex, PLC

(57) ABSTRACT

Mask design techniques for sharp corner printing in liquid crystal displays are disclosed using multiple patterns. The viewing angle and color quality of thin film transistor liquid crystal displays are largely dependent upon electrode corner sharpness as patterned in a given metal layer. Depending on design style, critical elements include convex angles, concave angles, or both convex and concave angles. Angle sharpness is dependent upon the resolution limit of a given exposure system. Since critical design element requirements exceed the capabilities of one mask, two or more masks are implemented. The determination of critical pattern features within a given layer identifies angles that are problematic for fabrication. The critical pattern features are decomposed into multiple mask layers. The resulting multi-pattern arrangement is used to fabricate the critical design elements that make up the needed angles.

32 Claims, 6 Drawing Sheets

MULTI-PATTERNING FOR SHARP CORNER PRINTING

FIELD OF ART

This application relates generally to design automation and more particularly to design automation using multi-patterning for sharp corner printing.

BACKGROUND

Integrated circuits are ubiquitous in modern electronic devices and systems. Modern, highly complex systems and devices are typically manufactured through an elaborate, multi-step process including both photolithographic and chemical processing. The processing is performed on a semiconductor substrate typically made of silicon, although other materials, including compound semiconductors formed from materials such as gallium arsenide, are also used. Modern fabrication processes may consist of hundreds or thousands of manufacturing and handling steps. In order for a given electronic device or system to function properly, every step in the fabrication process must be completed successfully. Each fabrication step has a unique purpose; for example, the photolithographic steps are used to print or expose desired features and patterns onto a semiconductor substrate. The printing process is reminiscent of old photographic processes involving shining light through a negative to expose light sensitive paper; extremely fine structures are printed onto a substrate using a mask and specific wavelengths of light. Following a printing step, the physical structures are realized when chemical processing is applied to the substrates. Returning to the photography analogy, the chemical processing "develops" the fine structures and patterns on the substrates much as certain chemicals develop images on photographic paper during traditional photographic processing. The chemical processing removes unwanted material at a particular level on the substrates while leaving the desired structures and patterns printed during the lithographic step intact. The photolithographic and chemical processing steps are repeated numerous times to produce the desired electronic devices and systems.

Many electronic devices and systems include some type of a display device. Many types of display devices exist, including plasma, light emitting diode (LED), liquid crystal (LCD), organic light emitting diode (OLED), organic liquid crystal (OLCD), and so on. The type of display that is chosen depends on the application. For example, depending on both the size of a display and a specific user's needs, the display may present information such as athletic events, movies, music play lists, photographs, phone numbers, stock quotes, games, news, and many other types of information. Display designers routinely must make tradeoffs during the design process in an effort to balance such factors as display clarity, brightness, physical size, complexity, power consumption, heat dissipation, fabrication complexity, cost, and myriad others. Each design decision may have a profound impact on the resulting display.

SUMMARY

Techniques implemented to improve fabrication of liquid crystal display electrodes are used to enhance sharp-corner printing of the electrodes. Critical design elements including acute angles are determined for a given mask layer. The acute angles may include convex (outside) angles, concave (inside) angles, or both convex and concave angles. Depending on design style, the mask layer is decomposed into a series of main masks and trim masks. Mask reversal is used to either convert convex angles into concave angles or concave angles into convex angles, as required by the design style. Two or more masks are used in a multi-patterning process to print electrodes on a metal layer of a TFT-LCD substrate. The multi-patterning process yields sharp electrode corners with acute angles. Critical angles may comprise convex angles, concave angles, or both convex and concave angles. A computer-implemented method for design analysis is disclosed comprising: obtaining a mask design for fabrication comprising at least one layer wherein the mask design includes acute angles; determining critical pattern features within the at least one layer; and decomposing the at least one layer based on the critical pattern features into multiple mask layers.

The mask design may comprise a design for LCD electrodes. The LCD electrodes may be part of in-plane switching thin film transistors. The acute angles may include angles sharper than 90 degrees. The acute angles may include angles sharper than 45 degrees. The method may further comprise producing a plurality of design masks based on the at least one layer wherein the plurality of masks constitute at least one more layer than the at least one layer. The critical pattern features may comprise concave corners, convex corners, or both convex and concave corners. The method may further comprise identifying a region from one layer wherein the critical pattern features include concave corners. The region may be decomposed into two main masks. The critical pattern features comprising concave corner types may be converted to convex corner types by performing mask reversal. A reversed mask, based on the mask reversal, may be further decomposed into one main mask and a trim mask. The method may further comprise identifying a region from one layer wherein the critical pattern features include convex corners. The region may be decomposed into one main mask and a trim mask. The critical pattern features may comprise convex corner types are converted to concave corner types by performing mask reversal. A reversed mask, based on the performing mask reversal, may be further decomposed into two main masks. The method may further comprise identifying a region wherein the critical pattern features include both convex corners and concave corners. The region may be decomposed into three masks. The three masks may comprise two main masks and one trim mask. The concave corners may be defined by stitches of the two main masks. The convex corners may be defined by applying cut patterns using a trim mask. The acute angles may be for LCD electrodes which provide for a large viewing angle. The acute angles for LCD electrodes may provide for sharp colors. The critical pattern features may be identified using pattern matching. The critical pattern features may be identified to improve design for manufacturability.

In embodiments, a computer system for design analysis comprises: a memory which stores instructions; one or more processors coupled to the memory wherein the one or more processors are configured to: obtain a mask design for fabrication comprising at least one layer wherein the mask design includes acute angles; determine critical pattern features within the at least one layer; and decompose the at least one layer based on the critical pattern features into multiple mask layers. In some embodiments, a computer program product embodied in a non-transitory computer readable medium for design analysis comprises: code for obtaining a mask design for fabrication comprising at least one layer wherein the mask design includes acute angles; code for determining critical pattern features within the at least one layer; and code for decomposing the at least one layer based on the critical pattern features into multiple mask layers.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
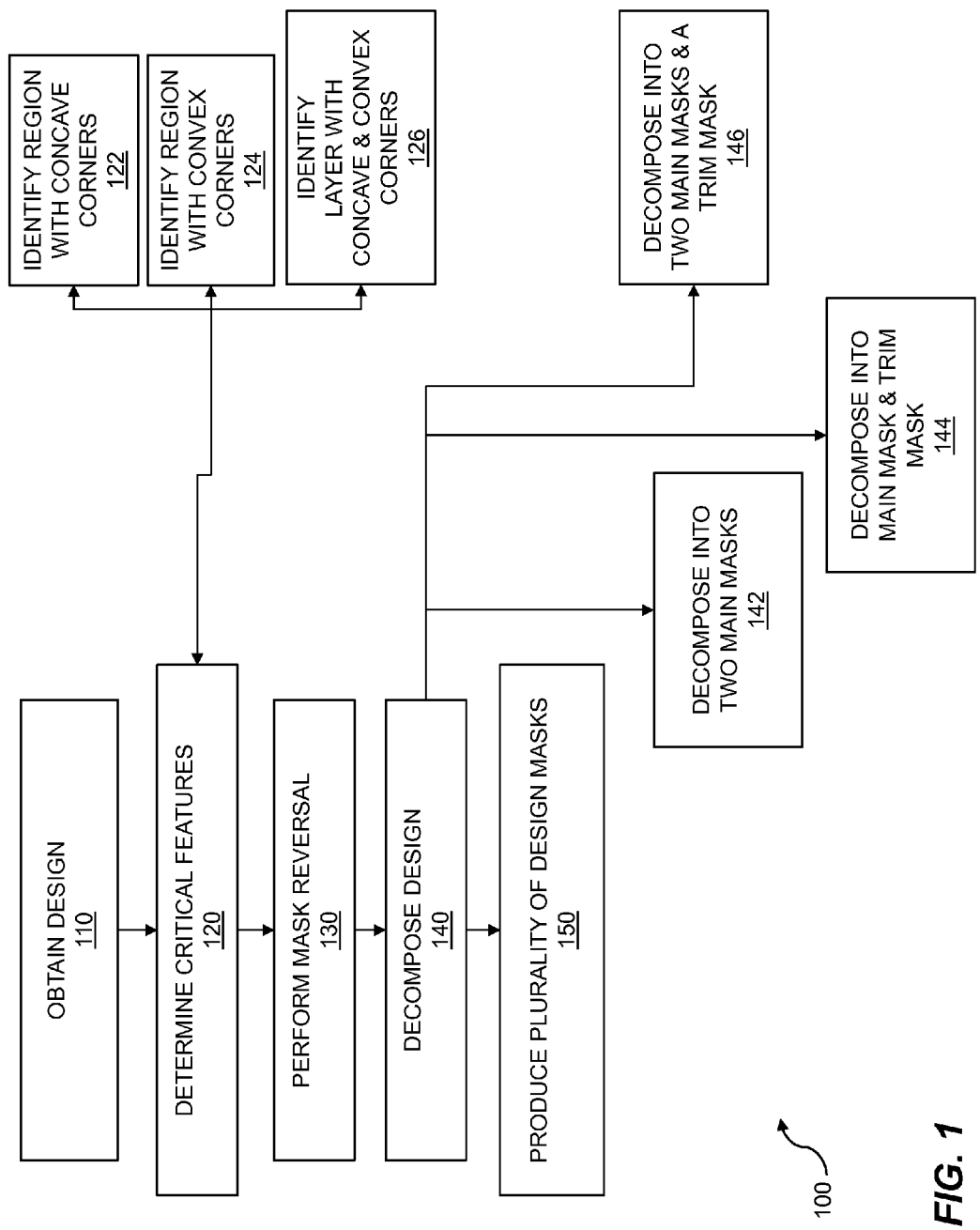
FIG. 1 is a flow diagram for handling mask designs.

Electronic display devices in modern systems are frequently based on semiconductor devices. The electronic devices and systems typically access the displays in order to present various types of information relevant to the user of the electronic device. Depending on the size of the display device, information may include sporting events, movies, photographs, stock quotes, play lists, news, phone numbers, and the like. The most common display type accessed by the electronic systems is the liquid crystal display (LCD). The LCD is routinely based on thin film transistor-liquid crystal display (TFT-LCD) technology. These displays are chosen for their light output, color range, resolution, power consumption characteristics, weight, thinness, and the like. As such they are ubiquitous in portable devices. Market and technology expansion and consumer demand drive continued improvement of TFT-LCD displays.

The viewing angle and color quality of a given TFT-LCD device is largely dependent upon the corner sharpness of electrodes on a metal layer within the display. The sharpness of these electrodes, in large part, determines the effectiveness of the display. For example, sharp electrodes increase the angle between e-field directions of different domains and stabilize the turning direction of liquid crystal molecules near the boundary between two domains, resulting in improved display performance. Depending on design style, the critical design elements comprise convex corners, concave corners, or both convex and concave corners.

From a fabrication point of view, sharp corners pose a very difficult implementation challenge due to the rounding of sharp corners that occurs during fabrication process. Rounding may be due to photolithographic and chemical processing limitations of the fabrication process. Present day LCD fabrication often uses ultraviolet (UV) light for the mask-based printing process. Due to the wavelength of the light used and the numerical aperture (NA) of the exposure machine, the resolution limit of the process is approximately equal to the critical dimension (CD) of the electrodes being fabricated. As a result of this high resolution limit, the fabrication process is unable to produce advanced electrode designs with sufficient angle sharpness. Further, previous techniques such as optical proximity correction (OPC) are not able to compensate for electrode angles less than approximately 45 degrees, an angle that is often larger than desired for the LCD electrodes.

Single mask (single pattern) exposure processes are effective for printing straight pattern edges but suffer from a severe corner-rounding effect. Multiple patterning processes can overcome severe corner rounding by using a main mask and a trim mask to produce convex corners. Similarly, the use of two main masks for the printing process can produce sharp concave corners. Both convex and concave sharp corners may coexist in a single electrode layer. In such instances, the sharp corners may be achieved by decomposing the layer into at least three masks: two main masks and a trim mask.

In the disclosed concept, a design mask is analyzed to discover critical design elements and to decompose the mask into two or more masks to control acute angle sharpness of the critical design elements of the mask layer. The critical design elements then determine the decomposition of the mask layer into a series of two or more masks. The two or more masks are then used in a multi-pattern printing process to fabricate the sharp corners of the critical design elements. The disclosed concepts are described in the context of LCD display electrodes but numerous other components could use these concepts including inductors and other semiconductor devices.

FIG. 1 is a flow diagram for handling mask designs. A flow 100 describes a computer-implemented method for design analysis where the design includes shapes describing masks that are to be implemented. Masks are used throughout semiconductor device manufacturing including for LCD display devices. The flow 100 comprises obtaining a mask design 110 for fabrication. The mask design may include shapes and patterning for multiple levels of design. The shapes can define metalization levels, polarization levels, filter levels, crystal levels, and the like. The obtaining can include importing a design or it can involve having the design already within a software tool. The obtaining can be part of an electronic design automation (EDA) process. The mask design may comprise a design for LCD electrodes. The electrodes may comprise a metal layer within the LCD device. Shaping of these electrodes within the LCD device is critical to the LCD display's operation. The LCD electrodes may be part of in-plane switching thin-film transistors. The various levels of the thin-film transistors may be defined by mask levels and those mask levels can include diffusion, well, polysilicon, metal, and other layers. The masks may be part of a multi-patterning printing process for printing critical design elements. The masks may comprise at least one layer wherein the mask design includes acute angles. Depending on design style, angles in the mask design may include critical design elements in the form of convex (outside) angles, concave (inside) angles, or both convex and concave angles. The acute angles enable LCD electrodes to provide a large viewing angle. In other embodiments, the acute angles for LCD electrodes may provide for sharp colors. By having well defined LCD electrodes the quality of display is radically improved.

The flow 100 includes determining 120 critical pattern features within the at least one layer. The critical features can be from one or more of the multiple layers included in the mask design. The critical features can describe various shapes including that of the LCD electrodes. The critical features can include sharp angles, both convex and concave in shape. Various techniques can be used to identify those critical features. The critical pattern features may be identified using pattern matching. The design layer may comprise any material used in the fabrication process including metal. A mask may represent the design layer of the LCD, for example. The critical pattern features may be identified to improve a design for manufacturability, to improve LCD performance, and the like. Design for manufacturability is very important to ensure high yield in processing and thereby improve profitability of the end product. In many cases, sharply angled electrodes are critical design elements. The determining may identify concave regions 122 within the layer. These concave or "inside" angles may represent some critical design elements of the layer. Similarly, the determining may identify convex regions 124 within the layer. As before, these convex or "outside" angles may represent some of the critical design elements of the layer. Further, the determining may identify concave and convex regions 126 within the layer. Both concave and convex angles may represent critical design elements of the layer. In certain cases, depending on design style, critical design elements include only convex angles, while in other cases critical design elements include only concave angles. In still other cases, both convex and concave angles comprise critical design elements. In some embodiments, when a group of angles of one type are identified, angles of one type are converted to another type by performing mask reversal 130. Mask reversal can include taking a negative image. In one case the electrode is defined but by taking the mask reversal, the shape around the electrode is defined. Likewise, in another case the space around the electrode is defined but by taking the mask reversal, the electrode is defined. Critical pattern features comprising concave corner types may be converted to convex corner types by performing mask reversal. Similarly, critical pattern features comprising convex corner types may be converted to concave corner types by performing mask reversal.

The flow 100 includes decomposing the design 140 which includes the at least one layer, based on the critical pattern features, into multiple mask layers. For a design comprising only critical concave corners, the mask for the layer may be directly decomposed into two main mask layers 142. The two main mask layers are illustrated later. In embodiments, the concave corners are converted into convex corners using mask reversal; the reversed mask may then be decomposed into a main mask layer and a trim mask layer. For the design comprising critical convex corners, the mask for the layer may be directly decomposed into a main mask layer and a trim mask layer 144. In some cases, the convex corners are converted into concave corners using mask reversal and then the reversed mask is decomposed into two main mask layers. For designs comprising both critical concave angles and convex angles, the mask may be decomposed into three mask layers comprising two main mask layers and a trim mask layer 146. In embodiments, sharp concave corners are defined by stitches of the two main mask layers, and sharp convex corners are defined by applying cut patterns on a trim mask layer.

The flow 100 may include producing a plurality of design masks 150 based on the at least one layer wherein the plurality of masks constitute at least one more layer than the at least one layer. In the case where an electrode is defined on one layer, two or three layers may result. Thus, two or three masks can be generated as part of the design process. These two or three masks can be manufactured and then used as part of the LCD fabrication process. Depending on the design, critical design elements may include only concave angles in which case two main mask layers may be produced. In other cases, concave corners are converted into convex corners using mask reversal with a main mask layer and a trim mask layer being produced. For a design including critical convex corners a main mask layer and a trim mask layer may be produced. In some situations, convex corners are converted into concave corners using mask reversal with two main mask layers being produced. For design including both critical concave angles and critical convex angles, a total of three masks may be produced, comprising two main mask layers and a trim mask layer. Masks for the sharp concave corners may be produced using stitches of the two main masks with cut patterns being applied using a trim mask to produce sharp convex corners. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
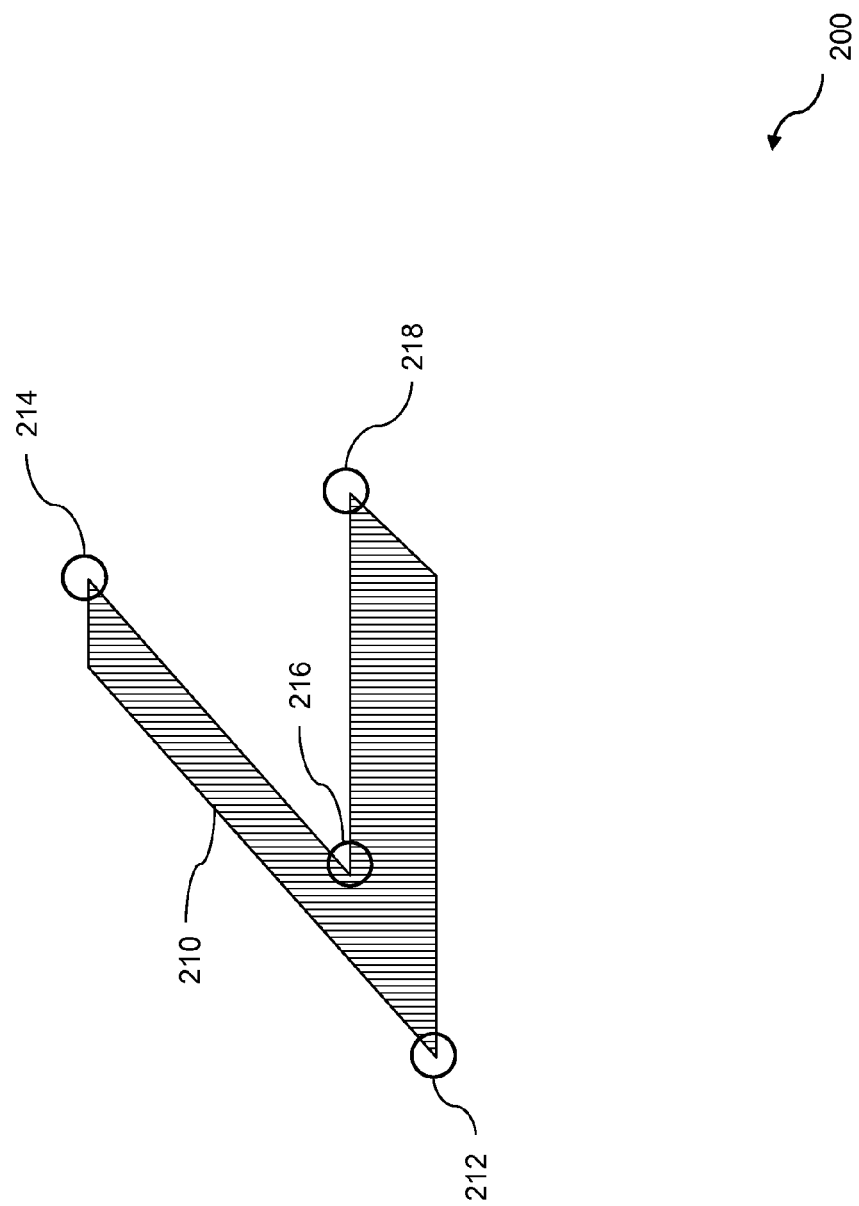
FIG. 2 shows example LCD electrode features.

FIG. 2 shows example LCD electrode features 200. An example electrode 210 with an acute angle is shown. The electrode 210 may comprise any conducting material, including metal. The shape of the electrode may be a critical feature of a given layer. Analysis may be performed on the layer to identify features which are considered critical design elements. Analysis may comprise identifying critical pattern features which may comprise concave corners, convex corners, or both convex and concave corners. Depending on design style, analysis may comprise identifying a region from one layer wherein the critical pattern features include only concave corners. In some cases, the acute angles include angles sharper than 90 degrees. In other cases, the acute angles include angles sharper than 45 degrees. The electrode 210 includes three convex corners 212, 214, and 218 as well as concave corner 216. Analysis of the shape 210 may be performed to identify critical pattern features including concave corners, convex corners, or both convex and concave corners.

Figure 3:
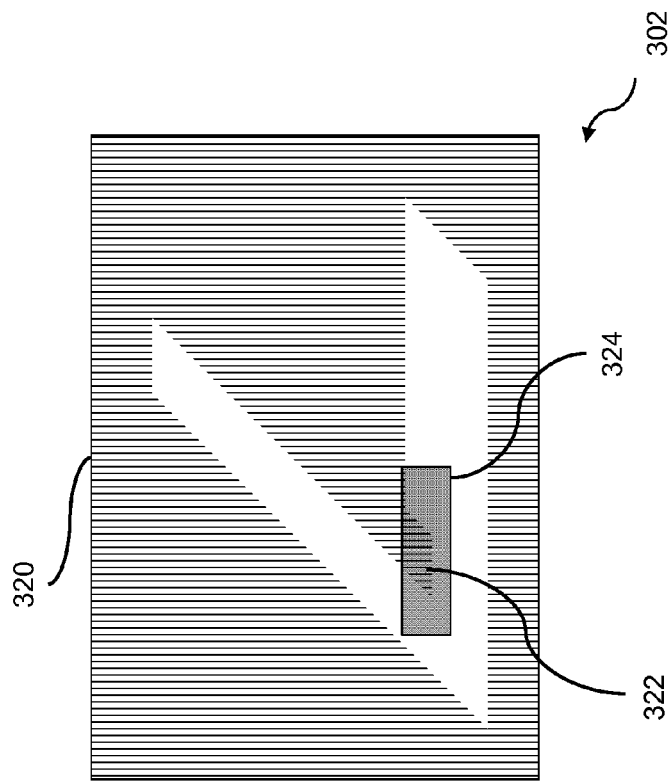
FIG. 3 shows example mask designs to handle critical concave corners.
Figure 3:
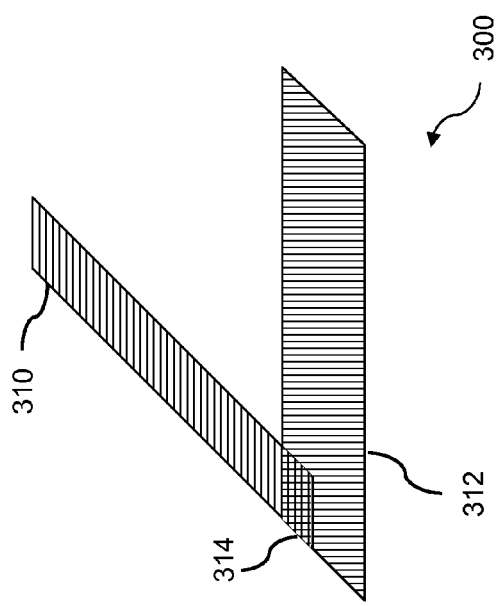

FIG. 3 shows example mask designs to handle critical concave corners. A group of shapes 300 is shown to illustrate using two main masks. The example shape 210, or something similar to it, may be produced using two main masks. A critical concave corner, similar to the example concave corner 216, may be identified by analysis of an electrode layer. Determining the appropriate masks to print the concave angle may be based on direct decomposition of an electrode layer. In the example 300, the identified layer has been decomposed into two main masks 310 and 312. Section 314 shows an overlap between the main mask 310 and the other main mask 312. By using the two main masks 310 and 312, a sharp concave corner can be fabricated for an LCD display.

A group of shapes 302 is shown to illustrate using a main mask and a trim mask where the main mask is determined using mask reversal. The group of shapes 302 describes masks that again handle fabrication of the example shape 210, or something similar to it. The design of the masks needed to print the concave angle is based first on mask reversal and then decomposition of the reversed mask. The critical concave corner, similar to the example concave corner 216, may be fabricated using a reversed mask 320, based off of the original shape 210. An additional tab 322 has been added to the reversed mask 320 to prevent rounding of the concave corner of concern. The added tab 322 is included as part of the design automation process. A trim mask 324 is also designed to remove any extra shape provided by the tab 322 with a result being a sharp concave corner.

Thus the group of shapes 300 or the group of shapes 302 may each include a plurality of masks based on at least one layer. The plurality of masks can constitute at least one more layer than the one layer that originally defined an electrode design. The group of shapes 300 or the group of shapes 302 show two different techniques for employing mask design to fabricate sharp LCD corners.

Figure 4:
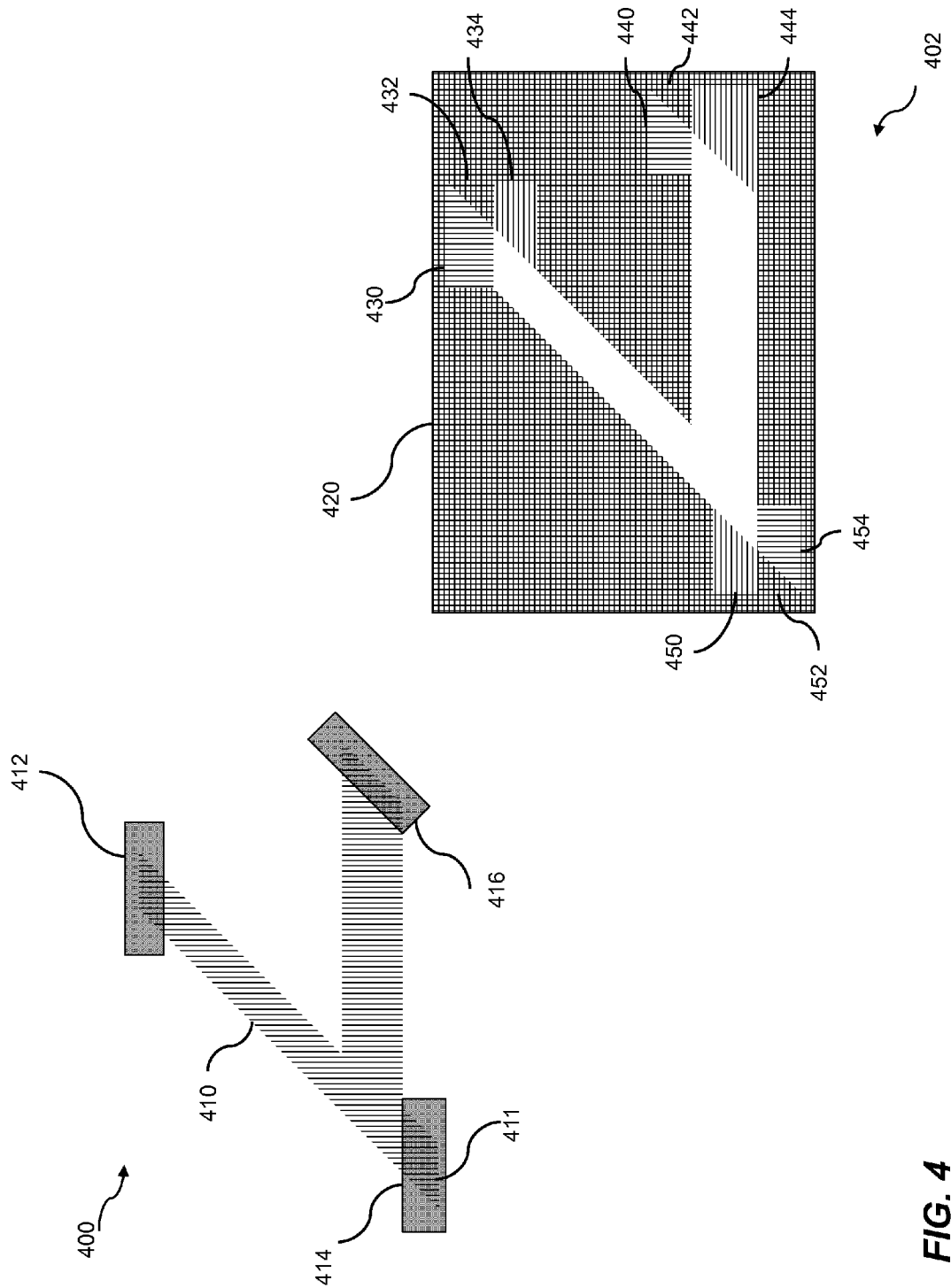
FIG. 4 shows example mask designs to handle critical convex corners.

FIG. 4 shows example mask designs to handle critical convex corners. Analysis of a design may include identifying a region from one layer where the critical pattern features include convex corners. A group of shapes 400 is shown to illustrate using a main mask and a trim mask. The example shape 210, or something similar to it, may be produced using a main mask and a trim mask to produce critical convex corners. Critical concave corners 212, 214, and 218 (or similar), may be identified by analysis of an electrode layer. Determining the appropriate masks to print the convex angles may be based on analysis of the electrode layer. In the example 400, the identified layer has been decomposed into a main mask 410 and a trim mask that includes shapes 412, 414, and 416. The main mask 410 includes a tab 411 to prevent rounding. The trim shape 414 is used to remove any extra material from the tab 411. By using the main mask and a trim mask, sharp convex corners can be fabricated for an LCD display.

A group of shapes 402 is shown to illustrate using two main masks. The example shape 210, or something similar to it, may be produced using two main masks to produce critical convex corners. In the example 402, the identified layer has been decomposed into two masks using mask reversal. The shape 210 is used with mask reversal to produce shape 420, representing an overlap of two main masks with the following exceptions or further explanations. Shape 450, shape 444, and shape 434 represent the presence of only a first main mask. Shape 454, shape 440, and shape 430 represent the presence of only a second main mask. Shape 432, shape 452, and shape 442 represent the presence of both main masks and therefore are continuations of the shape 420. By using the two main masks, based on mask reversal, sharp convex corners can be fabricated for the LCD display.

Figure 5:
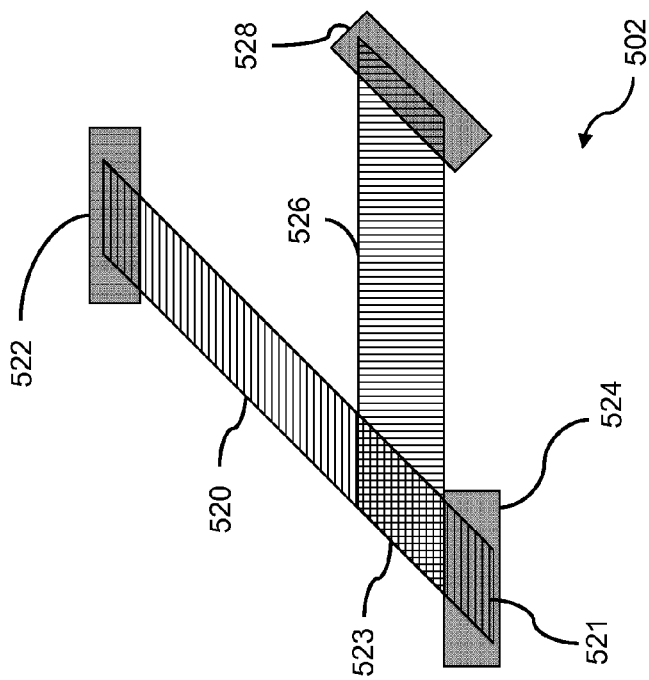
FIG. 5 shows an example mask design to handle both critical convex and critical concave corners.
Figure 5:
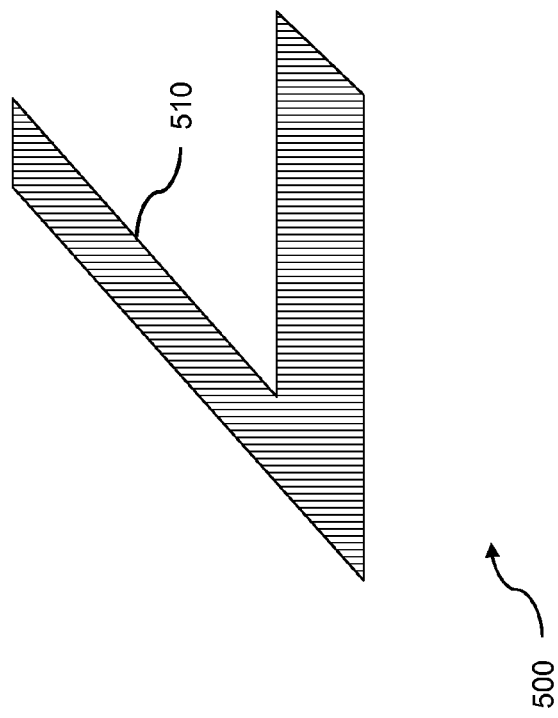

FIG. 5 shows an example mask design to handle both critical convex and critical concave corners. A target electrode pattern 500 and a group of shapes 502 comprising example design masks are shown. Design analysis may include identifying a layer where the critical pattern features include both convex corners and concave corners. The example target electrode pattern 500 is shown as shape 510. In the example group of shapes 502, the shape 510 has been decomposed into three masks comprising two main masks and one trim mask. A first main mask shape 520 is provided as well as a second main mask shape 526. A tab 521 has been added as part of the design process to shape 520 to prevent corner rounding. An overlap between the first main mask 520 and the second main mask 526 is shown as shape 523. The concave corner may be defined by stitches of the two main masks. A trim mask with shape 522, shape 524, and shape 528 may be used to produce the critical convex corners. The trim shape 524 removes any material from the tab 521. By using the two main masks and a trim mask, both sharp convex corners and sharp concave corners can be fabricated for the LCD display.

Figure 6:
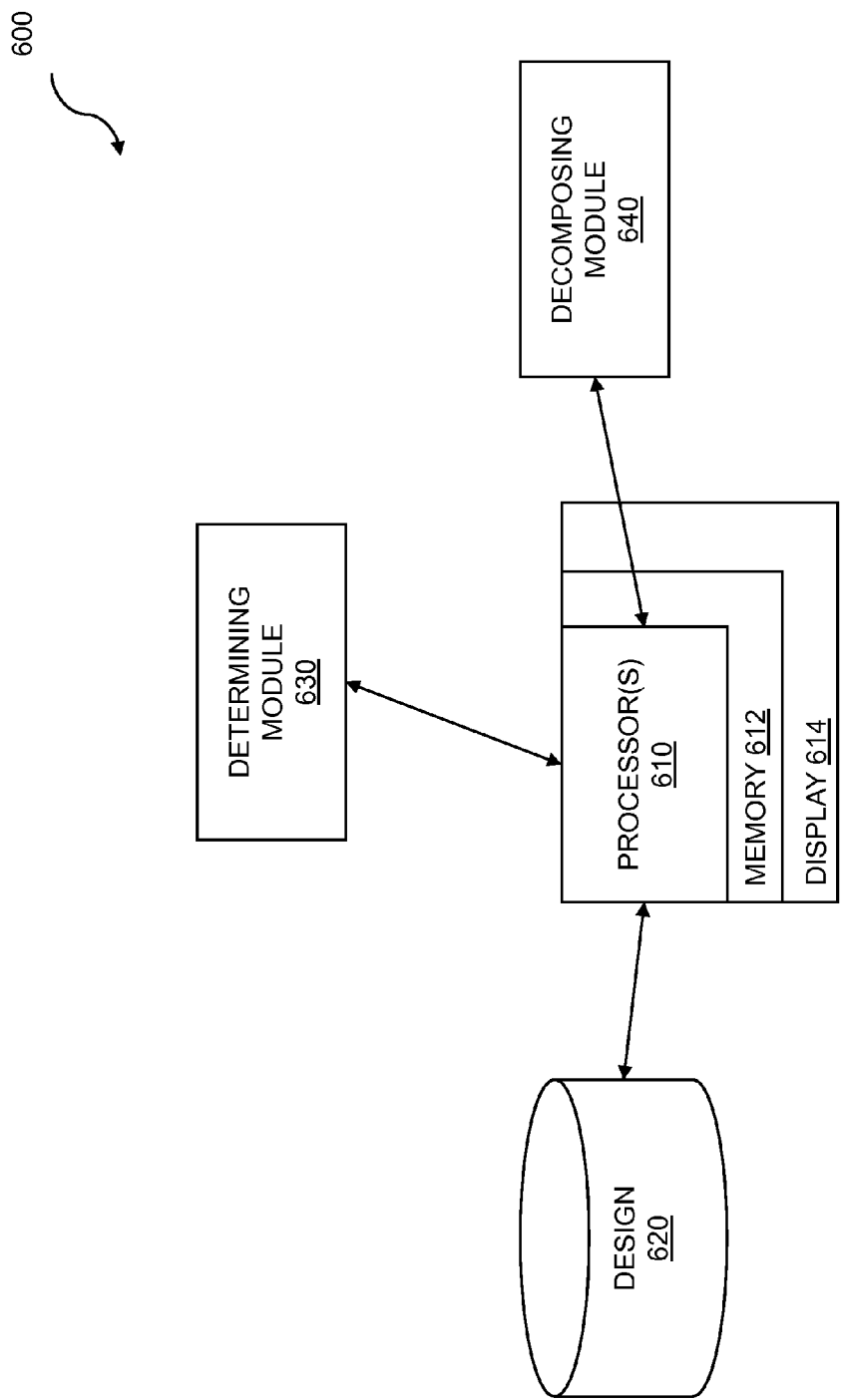
FIG. 6 is a system diagram for multi-pattern mask design.

FIG. 6 is a system diagram for multi-pattern mask design. A system 600 may include one or more processors 610 as well as a determining module 630 and a decomposing module 640. The one or more processors 610 are coupled to a memory 612, which stores instructions, and a display 614. The display 614 may be any electronic display, including but not limited to, a computer display, a laptop screen, a net-book screen, a tablet computer screen, a cell phone display, a mobile device display, a remote with a display, a television, a projector, or the like. The memory 612 may store code, mask information, layer information, design data, instructions, system support data, intermediate data, analysis results, and the like.

The processors 610 may be configured to access a design 620, the determining module 630, and the decomposing module 640. In at least one embodiment, the one or more processors 610 accomplish the functions of the determining module 630 and the decomposing module 640. The processors 610 may be configured to obtain a mask design for fabrication comprising at least one layer wherein the mask design includes critical angles. The mask layer may include a metal layer. The mask layer may be a layer in a display including a liquid crystal display. The processors 610 may be configured to determine 630 critical pattern features within the at least one layer. The critical pattern features may include critical angles. The critical angles may be convex ("outside") angles and/or concave ("inside") angles. The processors 610 may be configured to decompose 640 the at least one layer based on the critical pattern features into multiple mask layers. In embodiments, the one layer is decomposed into two layers, while in other embodiments the layer is decomposed into more than two layers. The number of layers into which a layer is decomposed may depend on whether the critical features include concave angles, convex angles, or both concave and convex angles. The determination module 630 may evaluate critical angles, including those in electrode layers, for the design. The decomposition module 640 may decompose objects of a given layer—including, for example, an electrode layer—into a series of masks. The masks resulting from the decomposition may comprise one or more main masks and may further comprise trim masks. The system 600 may include a computer program product embodied in a non-transitory computer-readable medium for design analysis comprising: code for obtaining a mask design for fabrication comprising at least one layer wherein the mask design includes acute angles; code for determining critical pattern features within the at least one layer; and code for decomposing the at least one layer based on the critical pattern features into multiple mask layers.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
   obtaining a mask design for fabrication comprising at least one layer wherein the mask design includes acute angles;
   determining critical pattern features within the at least one layer; and
   decomposing the at least one layer based on the critical pattern features into multiple mask layers.

2. The method of claim 1 wherein the mask design comprises a design for LCD electrodes.

3. The method of claim 2 wherein the LCD electrodes are part of in-plane switching thin film transistors.

4. The method of claim 1 wherein the acute angles include angles sharper than 90 degrees.

5. The method of claim 1 wherein the acute angles include angles sharper than 45 degrees.

6. The method of claim 1 further comprising producing a plurality of design masks based on the at least one layer wherein the plurality of masks constitute at least one more layer than the at least one layer.

7. The method of claim 1 wherein the critical pattern features comprise concave corners, convex corners, or both convex and concave corners.

8. The method of claim 1 further comprising identifying a region from one layer wherein the critical pattern features include concave corners.

9. The method of claim 8 wherein the region is decomposed into two main masks.

10. The method of claim 8 wherein the critical pattern features comprising concave corner types are converted to convex corner types by performing mask reversal.

11. The method of claim 10 wherein a reversed mask, based on the mask reversal, is further decomposed into one main mask and a trim mask.

12. The method of claim 1 further comprising identifying a region from one layer wherein the critical pattern features include convex corners.

13. The method of claim 12 wherein the region is decomposed into one main mask and a trim mask.

14. The method of claim 12 wherein the critical pattern features comprising convex corner types are converted to concave corner types by performing mask reversal.

15. The method of claim 14 wherein a reversed mask, based on the performing mask reversal, is further decomposed into two main masks.

16. The method of claim 1 further comprising identifying a region wherein the critical pattern features include both convex corners and concave corners.

17. The method of claim 16 wherein the region is decomposed into three masks.

18. The method of claim 17 wherein the three masks comprise two main masks and one trim mask.

19. The method of claim 18 wherein the concave corners are defined by stitches of the two main masks.

20. The method of claim 16 wherein the convex corners are defined by applying cut patterns using a trim mask.

21. The method of claim 1 wherein the critical pattern features are identified using pattern matching.

22. The method of claim 1 wherein the critical pattern features are identified to improve design for manufacturability.

23. A computer system for design analysis comprising:
a memory which stores instructions;
one or more processors coupled to the memory wherein the one or more processors are configured to:
obtain a mask design for fabrication comprising at least one layer wherein the mask design includes acute angles;
determine critical pattern features within the at least one layer; and
decompose the at least one layer based on the critical pattern features into multiple mask layers.

24. The system of claim 23 wherein the one or more processors are further configured to identify a region from one layer wherein the critical pattern features include concave corners.

25. The system of claim 24 wherein the critical pattern features comprising concave corner types are converted to convex corner types by performing mask reversal.

26. The system of claim 23 wherein the one or more processors are further configured to identify a region from one layer wherein the critical pattern features include convex corners.

27. The system of claim 26 wherein the critical pattern features comprising convex corner types are converted to concave corner types by performing mask reversal.

28. A computer program product embodied in a non-transitory computer readable medium for design analysis comprising:
code for obtaining a mask design for fabrication comprising at least one layer wherein the mask design includes acute angles;
code for determining critical pattern features within the at least one layer; and
code for decomposing the at least one layer based on the critical pattern features into multiple mask layers.

29. The computer program product of claim 28 further comprising code for identifying a region from one layer wherein the critical pattern features include concave corners.

30. The computer program product of claim 29 wherein the critical pattern features comprising concave corner types are converted to convex corner types by performing mask reversal.

31. The computer program product of claim 28 further comprising code for identifying a region from one layer wherein the critical pattern features include convex corners.

32. The computer program product of claim 31 wherein the critical pattern features comprising convex corner types are converted to concave corner types by performing mask reversal.

* * * * *